United States Patent [19]

Glogolja

[11] Patent Number: 4,588,904
[45] Date of Patent: May 13, 1986

[54] HIGH EFFICIENCY BIAS CIRCUIT FOR HIGH FREQUENCY INDUCTIVELY LOADED POWER SWITCHING TRANSISTOR

[75] Inventor: Miroslav Glogolja, Somerville, N.J.

[73] Assignee: AT&T Bell Laboratories, Murray Hill, N.J.

[21] Appl. No.: 532,774

[22] Filed: Sep. 16, 1983

[51] Int. Cl.⁴ ............................................. H03K 17/04
[52] U.S. Cl. .................................... 307/255; 307/254; 307/270; 307/300
[58] Field of Search ............................... 307/253–255, 307/270, 300, 317 R

[56] References Cited

U.S. PATENT DOCUMENTS

| | | | |
|---|---|---|---|
| 3,073,969 | 1/1963 | Skillen | 307/552 |
| 3,235,746 | 2/1966 | Karnaugh | 307/300 X |
| 3,243,510 | 3/1966 | Winston | 307/300 X |
| 4,221,979 | 9/1980 | Ahmed | 307/255 |
| 4,239,989 | 12/1980 | Brajder | 307/300 X |
| 4,266,149 | 5/1981 | Yoshida | 307/255 |

Primary Examiner—Stanley D. Miller
Assistant Examiner—D. R. Hudspeth
Attorney, Agent, or Firm—Alfred G. Steinmetz

[57] ABSTRACT

A turn off circuit for an inductivity loaded power switching transistor utilizes a transistor current path in the base circuit and two series connected diode junctions in the emitter circuit to reverse bias the base-emitter junction of the power switching transistor without the need for an active reverse bias voltage source.

3 Claims, 4 Drawing Figures

HIGH EFFICIENCY BIAS CIRCUIT FOR HIGH FREQUENCY INDUCTIVELY LOADED POWER SWITCHING TRANSISTOR

TECHNICAL FIELD

This invention relates to the switching of an inductively loaded power switching transistor and more particularly to improving the turn off performance of an inductively loaded power switching transistor.

BACKGROUND OF THE INVENTION

Power switching transistors in power conversion circuits are often connected to an inductive load such as an inductor used in filter circuits or a transformer leakage inductance. At high frequency operation, the turn off time delay due to stored charges and the collector current fall time of a power switching transistor limit its maximum operating frequency. By minimizing the storage and fall times, the operating frequency as well as the circuit efficiency can be increased. A conventional turn off method employs a circuit to reverse bias the emitter junction to effect the turn off function. Once reverse voltage is applied to the base-emitter current flow, the collector to emitter current flow remains unchanged due to the stored charge in the base collector region. Due to the lateral resistance in the base region, the collector to emitter current continues to flow through a much smaller emitter area significantly increasing the current density per unit area. Hence there are localized larger internal temperature increases concurring with the localized increased current density. To make the operation more difficult, an inductive circuit forces the collector to emitter voltage to its clamped value (very high) at the end of the storage time since at that moment the collector current begins to fall. This adds to the stress of the power transistor and very frequently is a cause for its destruction. In order to improve the switching performance of a power transistor, it is desirable to provide circuitry to both minimize the turn off time and minimize the current crowding within the emitter base region.

Solutions to the aforementioned problems have included using a bigger power transistor having a larger base-emitter junction area thereby reducing internal current density due to crowding during turn off; and the use of specialized turn off loss reduction networks connected to the power transistor which are operative to limit the rise in voltage across the power transistor during turn off. All of these solutions add to the cost of the circuit by requiring added circuitry not essential to the basic power processing function of the power supply and which are only utilized for protection of the power switching transistor.

SUMMARY OF THE INVENTION

Therefore a circuit for controlling the switching of an inductively loaded power switching transistor significantly alleviates the aforementioned turn off problems by providing a reverse bias at the base-emitter junction during turn off without the need for an active reverse bias power circuit. The circuit arrangement embodying the principles of the invention further provides a current path for the collector current flow during the transition from a saturated conducting state to a cutoff state.

The reverse bias is created in the illustrative embodiment disclosed herein by a pair of series connected diodes coupling the power switching transistor's emitter terminal to ground and by a current path transistor coupling its base to ground. This current path transistor is enabled from a nonconduction into a conduction state in response to the turn off bias signal applied to the power switching transistor.

BRIEF DESCRIPTION OF THE DRAWING

An appreciation and understanding of the invention may be attained by reference to the following specification and drawing in which.

DETAILED DESCRIPTION

Figure 1:
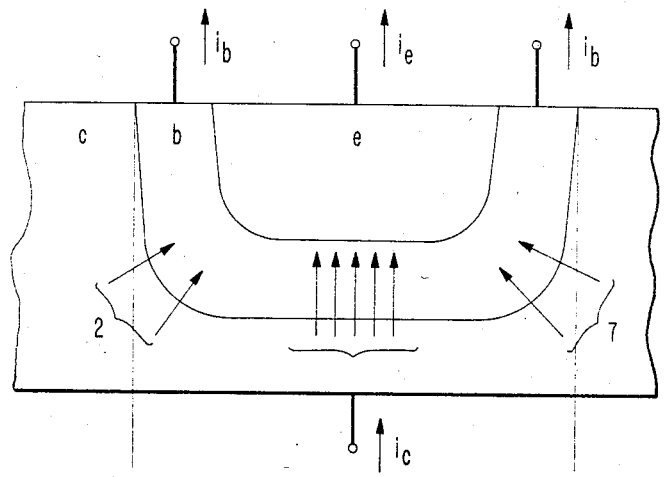
FIG. 1 is a cross section view of the physical structure of a power transistor switch showing a current flow pattern of the prior art.

The power handling capability of a power switching transistor is often limited by its power handling response during the on to off switching transition. This is partially due to the fact that turn off does not occur simultaneously or uniformly throughout the structure of the transistor. This is apparent in the schematic shown in FIG. 1 of a power switching transistor cross section which is partially into the turn off transition. As shown in FIG. 1, after a turn off bias has been applied, the current at the outer edge of the emitter region has been reduced to a small value as shown by the arrows 2 and 7. However, due to the fact that turn off is not simultaneous across the entire base-emitter junction area, the current at the center region shown by the arrows designated 1 is significantly higher than during the conduction period. At the end of the storage time, the collector to emitter voltage is forced to its clamped value by the inductive load, raising the local junction temperature significantly and creating a hot spot which could cause a failure of the transistor.

Figure 2:
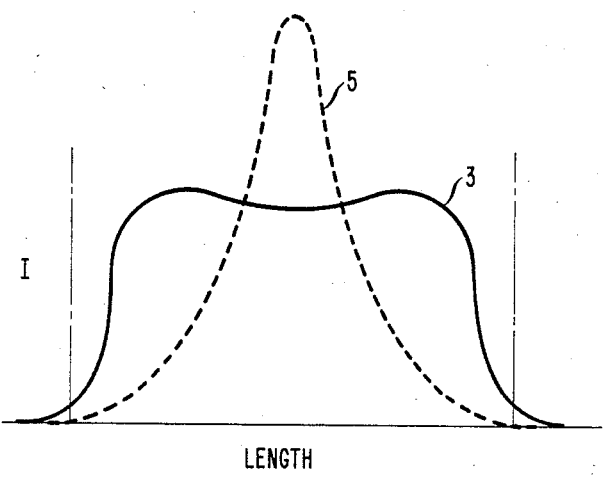
FIG. 2 shows current waveforms to describe the spacial distribution of the current in the power transistor switch structure in FIG. 1.

The spatial distribution of current of the cross section of FIG. 1 is shown in FIG. 2 wherein solid line 3 represents current distribution across the emitter base surface with the transistor fully conducting and dotted line 5 represents a typical current distribution when the transistor is being turned off.

Figure 3:
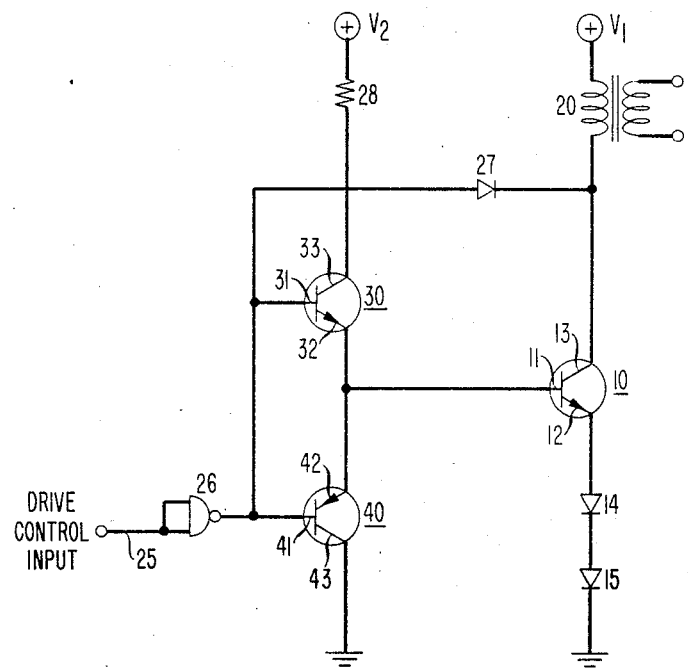
FIG. 3 is a circuit schematic of a power switching circuit embodying the principles of the invention.
Figure 4:
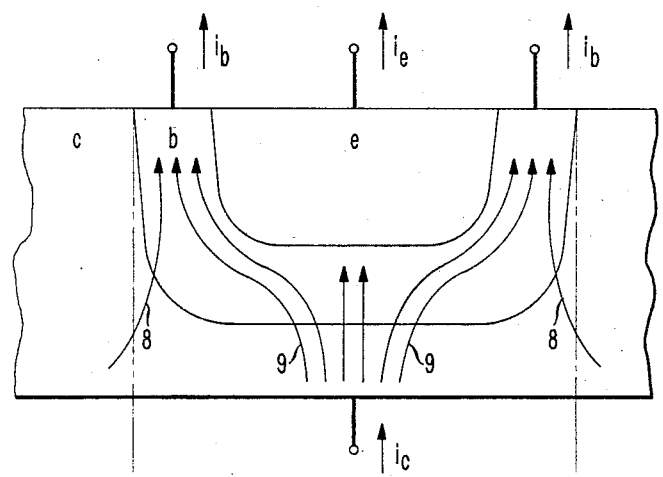
FIG. 4 is a cross section of the physical structure of a power transistor switch showing a current flow pattern according to the principles of the invention.

The power switch control circuit of FIG. 3 is operative to reduce the turn off transition time and also to provide a load current path through the base electrode during turn off so that current flow during turn off does not go through the emitter, but rather spreads toward the outer edges of the base-emitter junction area and through the base terminal and is hence more evenly distributed thereacross in order to limit the occurrence of hot spots. The mechanism of this type of turn off is quite different from the conventional one because it diverts the collector to emitter current flow from the emitter electrode into the base electrode. This means that the collector current continues to flow while the emitter current starts to fall virtually at the moment of activating the path between the base electrode and ground. The result is greatly improved switching speed (reduction of storage and fall times) with added benefit of elimination of the current crowding mechanism. This new current flow path in a circuit embodying the principles of the invention is shown in FIG. 4 where the current flow arrows 8 and 9 indicate that the majority of current flow proceeds from collector to base in the transistor structure.

The circuit shown in FIG. 3 comprises an NPN power transistor switch 10 having its collector 13 coupled to a winding 20 which may be an inductor or a transformer winding which in turn is coupled to a voltage source $V_1$. The emitter 12 is connected through two series connected diodes 14 and 15 to ground.

Drive signals to control the conduction state of power transistor switch 10 are coupled to input lead 25 which is in turn connected to NAND gate 26 operative to provide a sharp transition definition to the drive signal. While a NAND gate is shown in the illustrative embodiment, it is to be understood that other suitable logic circuits such as inverters with a sharp signal transition are also suitable. The output of NAND gate 26 is connected in parallel to base electrodes 31 and 41 of NPN transistor 30 and PNP transistor 40, respectively; and via diode 27 to the collector 13 of power transistor switch 10. The transistors 30 and 40 are connected in series, with the emitter electrodes 32 and 42 coupled to the base electrode 11 of transistor 10. Collector 33 is coupled through resistor 28 to voltage source $V_2$ and collector 43 is connected to ground. Transistors 30 and 40 are of opposite types (i.e., NPN and PNP types, respectively) so that when one is conducting, the other is cut off.

Consequently when a negative signal is applied to input lead 25, transistor 30 is biased conducting and supplies base drive current from source $V_2$ through resistor 28 to base 11 biasing transistor 10 into a saturated conducting condition. Current flows from voltage source $V_1$ through winding 20, the collector emitter path of transistor 10 and diodes 14 and 15 to ground. Diode 27 couples the output of NAND gate 26 to collector 13 and is operative to limit the degree of saturation the transistor 10 can attain during its conducting interval. The nonlinear feedback of diode 27 restrains power switching transistor 10 from going too deeply into saturation when it is turned on.

Turn off of transistor 10 is initiated by application of a positive signal to input terminal 25. The output of NAND gate 26 is applied to base electrodes 31 and 41 turning transistors 30 and 40 off and on, respectively.

Transistor 40 is chosen with characteristics so that its saturated collector emitter voltage drop, and hence the voltage at base 11, is less than or equal to the junction voltage drop of one of the diodes 14 or 15. The voltage level of emitter 12 is approximately two diode voltage drops above ground potential. So as soon as transistor 40 is driven into saturation, the base 11 of transistor 10 is one diode drop voltage level above ground potential while the emitter 12 is at a two diode drop voltage level above ground potential which is due to current flow there through or due to stored charge on the parasitic capacitances of diodes 14 and 15.

This arrangement thereby insures that the voltage of emitter 12 is higher than the voltage at base 11 during the turn off process and reverse biases the base-emitter junction of transistor 10. Since transistor 40 is biased fully conducting the collector current due the inertial loading of winding 20 flows from collector 13 to base 11 and through transistor 40 to ground potential. Hence the emitter current stops flowing while the collector current continues to flow out of the base terminal 11 thereby eliminating the cause of the emitter current crowding and hot spotting. Since all of the collector current flows out of the base terminal 11, recombination of all carriers is greatly accelerated resulting in faster switching speed.

After turn off, transistor 10 remains cut off, until a subsequent turn on signal, due to the voltage barrier of the two diodes 14 and 15.

The bias circuit described herein advantageously improves dynamic characteristics of a power switching transistor by increasing the turn off speed. Its performance compares favorably with techniques utilizing active reverse bias sources. The diodes 14 and 15 may be ordinary 60 Hz diodes even though the transistor switch may operate at frequencies exceeding 30 kHz since proper operation does not depend upon high speed recovery of the diodes.

While a specific embodiment of the invention has been disclosed herein, other embodiments employing the principles of the invention will be readily apparent to those skilled in the art.

What is claimed is:

1. A power switching circuit comprising:
   a transistor switch including a collector, an emitter and a base;
   a second transistor having a first conductivity type and connected to couple a turn-on bias voltage to the base of the transistor switch;
   a third transistor having a second conductivity type opposite the first conductivity type and including a collector emitter path connected to couple the base of the transistor switch to ground potential and operative as a low impedance current path to bias the transistor switch nonconducting;
   logic means for applying a common bias signal to base electrodes at the second and third transistors so that the second and third transistors are always in opposite conductivity modes;
   first and second diodes connected in series coupling the emitter of the transistor switch to ground, and providing sufficient voltage drop so that a voltage drop across the first and second diodes exceeds a voltage drop across the collector emitter path of the third transistor when it is conducting; and
   an anti-saturation diode coupling the base electrode of the second and third transistors to the collector of the transistor switch.

2. A power switching circuit comprising:
   a transistor switch including a collector, an emitter and a base;
   means for controlling a conductivity state of the transistor switch including;
   second and third transistors of opposite conductivity type to one another and having their emitter electrodes joined in common to the base of the transistor switch;
   drive control means coupled to control a conductivity state of the second and third transistors in opposite modes of conductivity including a binary logic circuit coupled to apply bilevel signals in common to base electrodes of the second and third transistors, the third transistor coupling a bias voltage to bias the transistor switch conductive and the second transistor coupling a ground reference to bias the transistor switch nonconductive;
   at least first and second diodes coupling the emitter of the transistor switch to the ground reference and operative for maintaining the emitter at the transistor switch at a slightly higher voltage than a voltage drop across a collector emitter path at the second transistor when it is conducting; and a feedback path including an anti-saturation diode coupling a base electrode at the second and third transistors to the collector of the transistor switch.

3. A power switch as defined in claim 2 wherein recovery time of the first and second diodes is slow relative to a switching speed at the transistor switch.

* * * * *